(12) United States Patent
Doy

(10) Patent No.: US 7,061,327 B2
(45) Date of Patent: Jun. 13, 2006

(54) SINGLE SUPPLY HEADPHONE DRIVER/CHARGE PUMP COMBINATION

(75) Inventor: Tony Doy, Sunnyvale, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 693 days.

(21) Appl. No.: 10/056,994

(22) Filed: Jan. 24, 2002

(65) Prior Publication Data

US 2003/0138112 A1    Jul. 24, 2003

(51) Int. Cl.
   *H03F 3/04*    (2006.01)
(52) U.S. Cl. ........................ 330/297; 330/296
(58) Field of Classification Search .......... 330/297, 330/296, 285, 307; 307/296.1
   See application file for complete search history.

(56) References Cited

U.S. PATENT DOCUMENTS

| | | | |
|---|---|---|---|
| 4,780,625 A | 10/1988 | Zobel | |
| 5,122,759 A | 6/1992 | Nodar | |
| 5,280,235 A | 1/1994 | Neale et al. | |
| 5,289,137 A * | 2/1994 | Nodar et al. | 330/296 |
| 5,455,523 A | 10/1995 | Wallace et al. | |
| 5,563,526 A | 10/1996 | Hastings et al. | |
| 5,625,278 A | 4/1997 | Thiel et al. | |
| 5,760,652 A * | 6/1998 | Maemura et al. | 330/297 |
| 6,011,440 A * | 1/2000 | Bell et al. | 330/297 |
| 6,178,247 B1 * | 1/2001 | Ogita | 381/74 |
| 2002/0008584 A1 | 1/2002 | Manjrekar et al. | |
| 2002/0186490 A1 | 12/2002 | Jiang et al. | |

FOREIGN PATENT DOCUMENTS

| | | |
|---|---|---|
| EP | 0651500 | 5/1995 |
| JP | 2002092802 | 3/2002 |

\* cited by examiner

*Primary Examiner*—Henry Choe
(74) *Attorney, Agent, or Firm*—Perkins Coie LLP

(57) ABSTRACT

A headphone driver amplifier operative from a single DC voltage supply, coupled directly to the headphone speakers without the need for DC coupling capacitors used for preventing DC reaching the headphones. An onboard power supply generates a negative voltage rail which powers the output amplifiers, allowing driver amplifier operation from both positive and negative rails. Since the amplifiers can be biased at ground potential (0 volts), no significant DC voltage exists across the speaker load and the need for DC coupling capacitors is eliminated.

15 Claims, 8 Drawing Sheets

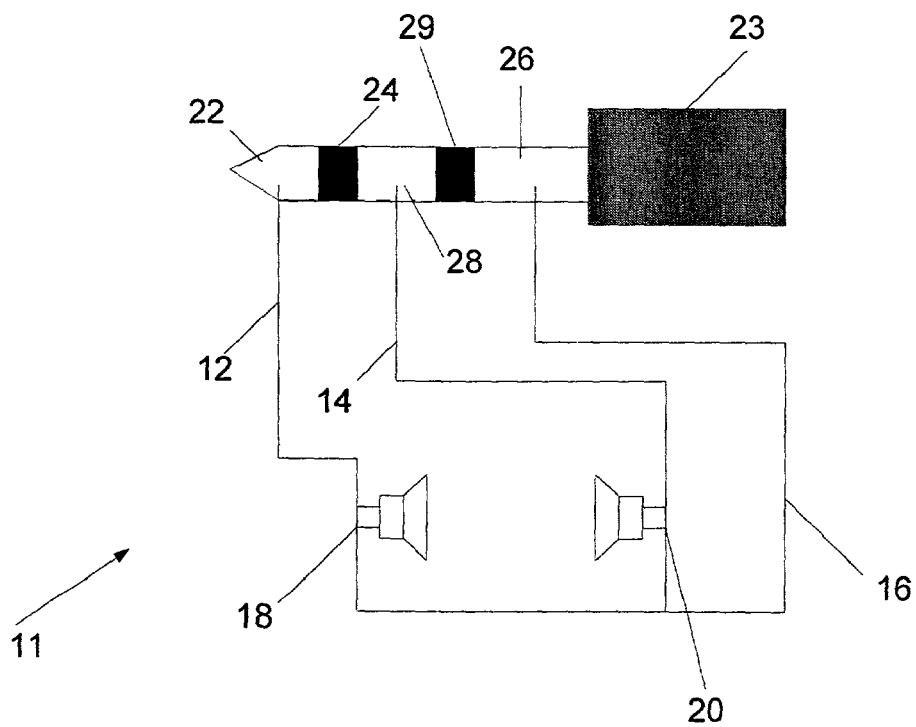
(PRIOR ART) FIG. 1B
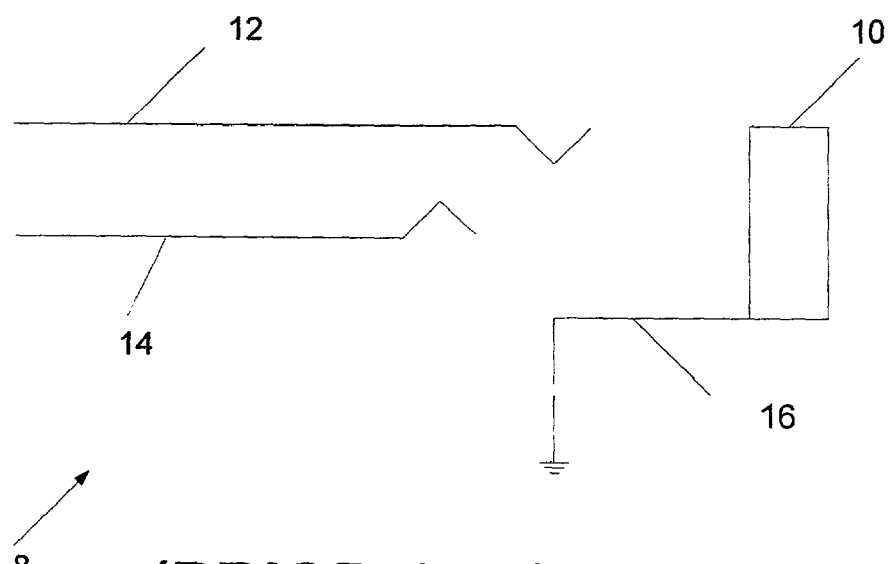
(PRIOR ART) FIG. 1A

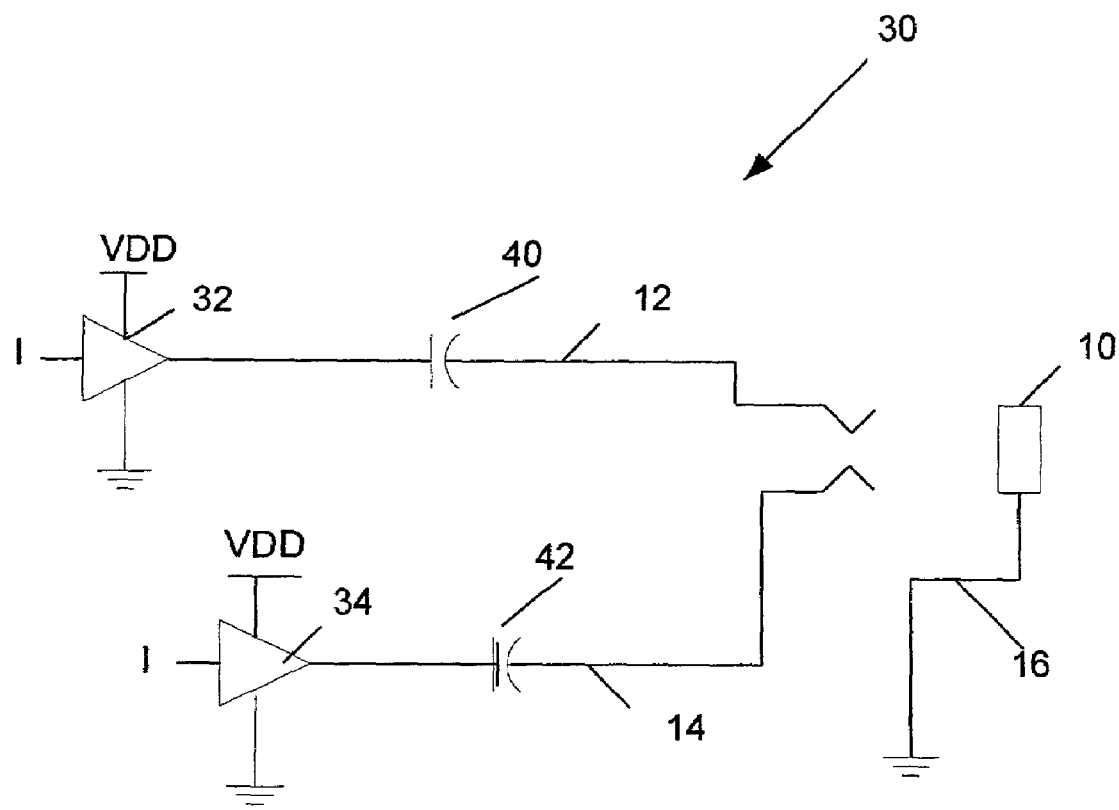
(PRIOR ART) FIG. 2

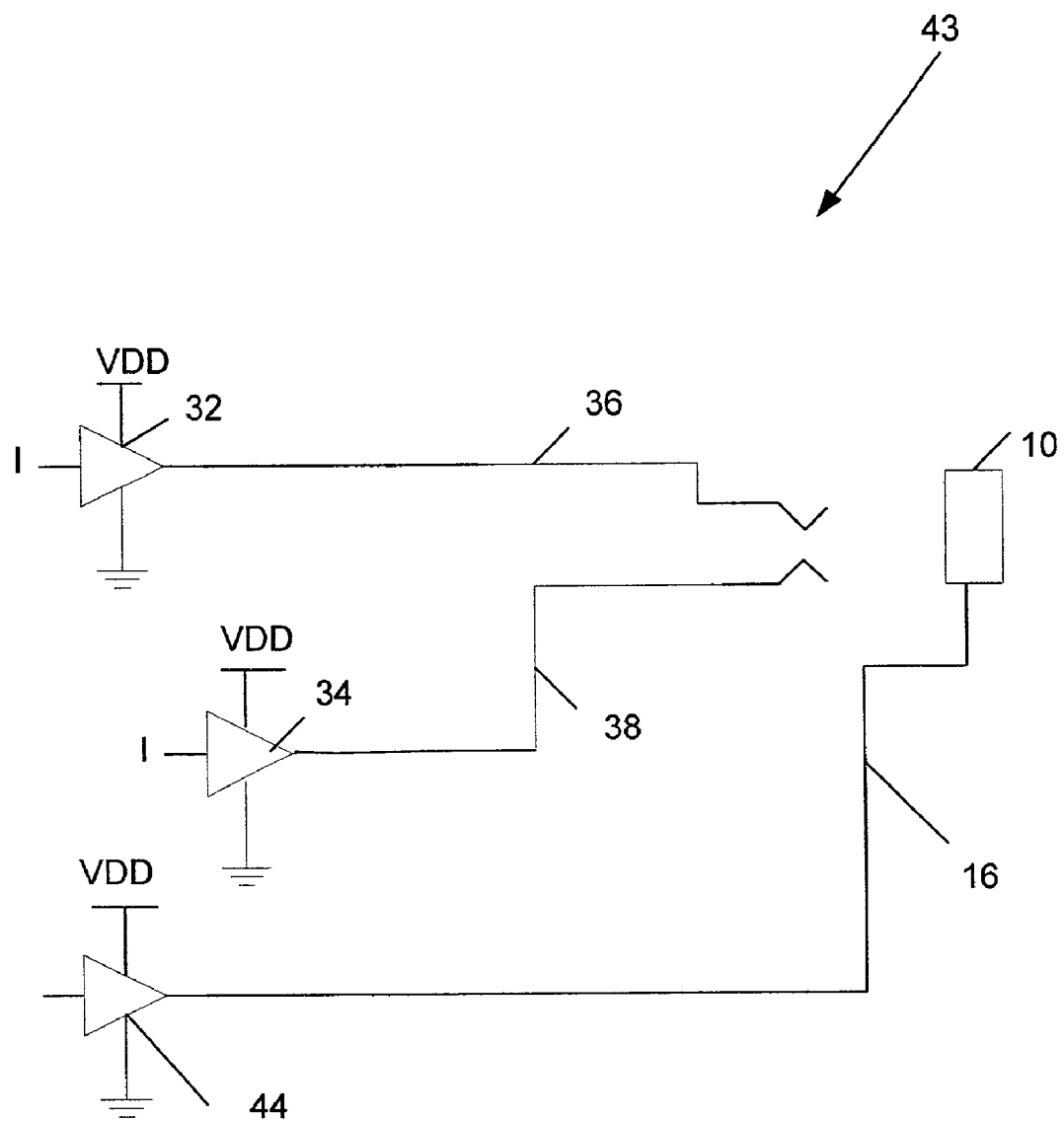
(PRIOR ART) FIG. 3

SINGLE SUPPLY HEADPHONE DRIVER/CHARGE PUMP COMBINATION

FIELD OF THE INVENTION

This invention relates generally to amplifier circuits and more particularly to headphone driver amplifier circuits operating from a single positive voltage supply.

BACKGROUND OF THE INVENTION

Systems and devices using headphones are ubiquitous in many fields of technology. The trend to miniaturize electronic devices has resulted in the need for smaller headphone devices.

PRIOR ART FIG. 1A illustrates a typical headphone connectivity diagram 8. The right headphone lead 12 and the left headphone lead 14 couple to the right and left headphone speakers respectively represented here by a headphone load 10 to the rest of the system. Each headphone load 10 as well as the overall system is connected to a common ground 16.

PRIOR ART FIG. 1B illustrates a prior art stereo headphones system 11 using a 3-way "jack socket" design for connecting a pair of headphones to a stereo system. As shown in FIG. 1B, the 3-way jack-socket design 11 is made of three electrically isolated portions 22, 26, and 28, dividers 24 and 29, and a body 23. The design of the 3-way jack socket allows for the use of a single jack socket 11 to connect a pair of headphones 18 and 20 via the leads 12 and 14 and the common ground lead 16. As illustrated herein PRIOR ART FIG. 1A, the 3-way jack-socket system 11 includes the tip 22 which couples the left headphone speaker 18 to the stereo system via the lead 12. Similarly, the middle portion 28 of the jack socket 23 couples the right headphone speaker 20 to the stereo system via the lead 14. A rear portion 26 of the jack socket 23 connects the common return for the left 18 and the right 20 headphones to a common ground 16 that may be connected to the stereo system chassis to form a common ground. Dividers 24 and 29 electrically isolate from each other, the various electrically charged portions 22, 26 and 28 of the 3-way jack-socket.

Each headphone may be represented by a resistive headphone load to be driven by the incoming signals. Typical value for the resistive load of a headphone speaker is in 16 to 32 $\Omega$(ohm) range.

PRIOR ART FIG. 2 illustrates a typical headphone driver amplifier circuit 30. The headphone driver amplifier circuit 30 includes a pair of headphone amplifiers 32 and 34, a pair of DC coupling capacitors 40 and 42, and a pair of outputs leads 12 and 14 connecting the headphone amplifiers to the headphone speakers represented by the headphone load 10.

As shown in PRIOR ART FIG. 2, the incoming (driving) signals are amplified before reaching each headphone. In the cases where the headphones are used with portable electronic devices such as portable cassette players or portable CD players, a single positive power supply such as a battery is the only source of power. In a typical portable device, headphone driver amplifiers are from a single supply (e.g. a 5 volts or 3.3 volts battery). In order to accurately reflect the incoming signals amplified by the headphone amplifiers 32 and 34, the outputs of the headphone amplifiers 32 and 34 are biased at mid-rail ($V_{DD}/2$) allowing for the generation of both positive and negative going signals without clipping. As a result, the output of the amplifiers 32 and 34 are at a higher DC voltage with respect to ground. In order to prevent high currents from flowing through the headphones and having the headphones in a continuously on state, direct current (DC) coupling capacitors such as 40 and 42 are inserted in series with the output of the amplifiers 32 and 34, in order to prevent a DC current from reaching the headphones. The DC coupling capacitors 40 and 42 act as a high pass filter preventing DC and very low frequency signals from reaching the headphones. In order to reproduce low frequency input signals into the 16–32 $\Omega$(ohm) load of a typical headphone, the value of these DC coupling capacitors needs to be in the 100–470 µF (micro Farad) range. However, physical size of a 100–470 µF capacitor is prohibitively large and prevents miniaturization of the headphone circuitry. The physical size and cost of these DC blocking capacitors 40 and 42 is of a greater importance in the design of portable equipment and therefore implementing an amplifier topology that either completely eliminates the DC blocking capacitors or reduces their value and size is desirable.

Returning to PRIOR ART FIG. 2, the incoming signal I is input to the two power amplifiers 32 and 34. In order to generate positive and negative going incoming signals without signal clipping, the amplifiers 32 and 34 are typically biased at mid-rail (VDD/2), and thus the positive and negative power supply terminals of the two amplifiers 32 and 34 are connected to the positive power supply VDD and ground (VSS) respectively. As a result, the outputs 36 and 38 of the input amplifier 32 and 34 need to be coupled to the left 18 and right 20 headphones through DC blocking capacitors 40 and 42 respectively. As previously discussed, in order to reproduce low frequencies into the typical 16 to 32 ohm headphones, the size of the DC blocking capacitors has to be in 100 to 470 µF range. The physical dimensions for these internal capacitors is very large and the size acts as a barrier to much desired miniaturization of the headphone driver amplifier circuit 30.

PRIOR ART FIG. 3 illustrates one prior art solution eliminating the need for DC coupling capacitors. A prior art driver amplifier circuit 43 includes a pair of headphone amplifiers 32 and 34 directly coupled to a headphone load 10 through a pair of leads 36 and 38, and a third amplifier 44 connected to the headphone load 10 via the lead 16. The headphone load 10 (representing the headphones 18 and 20) is biased between ground (GND) and the supply voltage VDD. With both headphone amplifiers biased to approximately the same DC value, very little DC current flows through the headphones, and the third amplifier sinks or sources current as necessary. Although the circuit depicted in PRIOR ART FIG. 3 eliminates the need for large DC coupling capacitors, this system has the disadvantage of having a common return 16 that must now be isolated from the equipment chassis since it has a DC voltage on it. This isolation introduces additional problems such as possible circuit damage if the electrical isolation of the common return from the rest of the system fails.

Therefore, it is desirable to provide a circuit headphone amplifier system that could operate from a single positive voltage supply, and which does not require the usual large DC coupling capacitors or need the physical isolation of the common return of the headphones.

SUMMARY OF THE INVENTION

The system of the present invention, allows a headphone driver amplifier to operate from a single voltage supply, yet does not require the usual series coupling capacitors used for preventing DC current from reaching the headphones. An on-board power supply generates a negative voltage rail, which powers the output amplifiers, allowing driver amplifier operation from both positive and negative rails. In this way, the amplifier can be biased at ground (0 volts) potential, generating no significant DC voltage across the headphone load (the headphones speakers).

Briefly, one aspect of the present invention is embodied in a circuit enabling a headphone driver amplifier to operate from a single voltage supply comprising of an amplifier having an output coupled to a headphone, the amplifier having a first and a second power supply lead, the first power supply lead connected to a positive supply voltage, and a DC voltage to voltage converter having an output and a power source lead connected to the positive voltage supply, the output of the charge pump circuitry connected to the second power supply lead, and the charge pump generating an output voltage at the output that is substantially equal in magnitude to some quanta of the negative of the power supply voltage.

BRIEF DESCRIPTION OF THE DRAWINGS

PRIOR ART FIG. 1A illustrates a typical headphone connectivity diagram;

PRIOR ART FIG. 1B illustrates a prior art stereo headphones design 11 using a 3-way "jack socket" design for connecting a pair of headphones to a stereo system;

PRIOR ART FIG. 2 illustrates a typical prior art headphone driver amplifier circuit;

PRIOR ART FIG. 3 illustrates one prior art solution eliminating the need for DC coupling capacitors;

DETAILED DESCRIPTION OF THE PREFERRED EMBODIMENTS

Prior art headphone driver systems for portable devices operate off of a single power supply, requiring the biasing of the headphones at mid-range of the power supply in order to fully represent the incoming signal without the danger of any clipping. As a result, these prior art systems require DC blocking capacitors to be used in series with the amplifiers driving the headphones. The value and physical size of these DC coupling capacitors are prohibitively large and limit miniaturization highly desired in most systems.

One aspect of the present invention allows for a headphone driver/amplifier circuits to operate off of a single voltage supply, without requiring the usual series coupling capacitors necessary for preventing DC current from reaching the headphones An on-board power supply generates a negative voltage rail, which powers the output amplifiers, allowing driver amplifier operation from both positive and negative rails. In this way, the amplifier can be biased at ground (0 volts) potential, generating no significant DC voltage across the headphone load (the headphones speakers).

Figure 4:
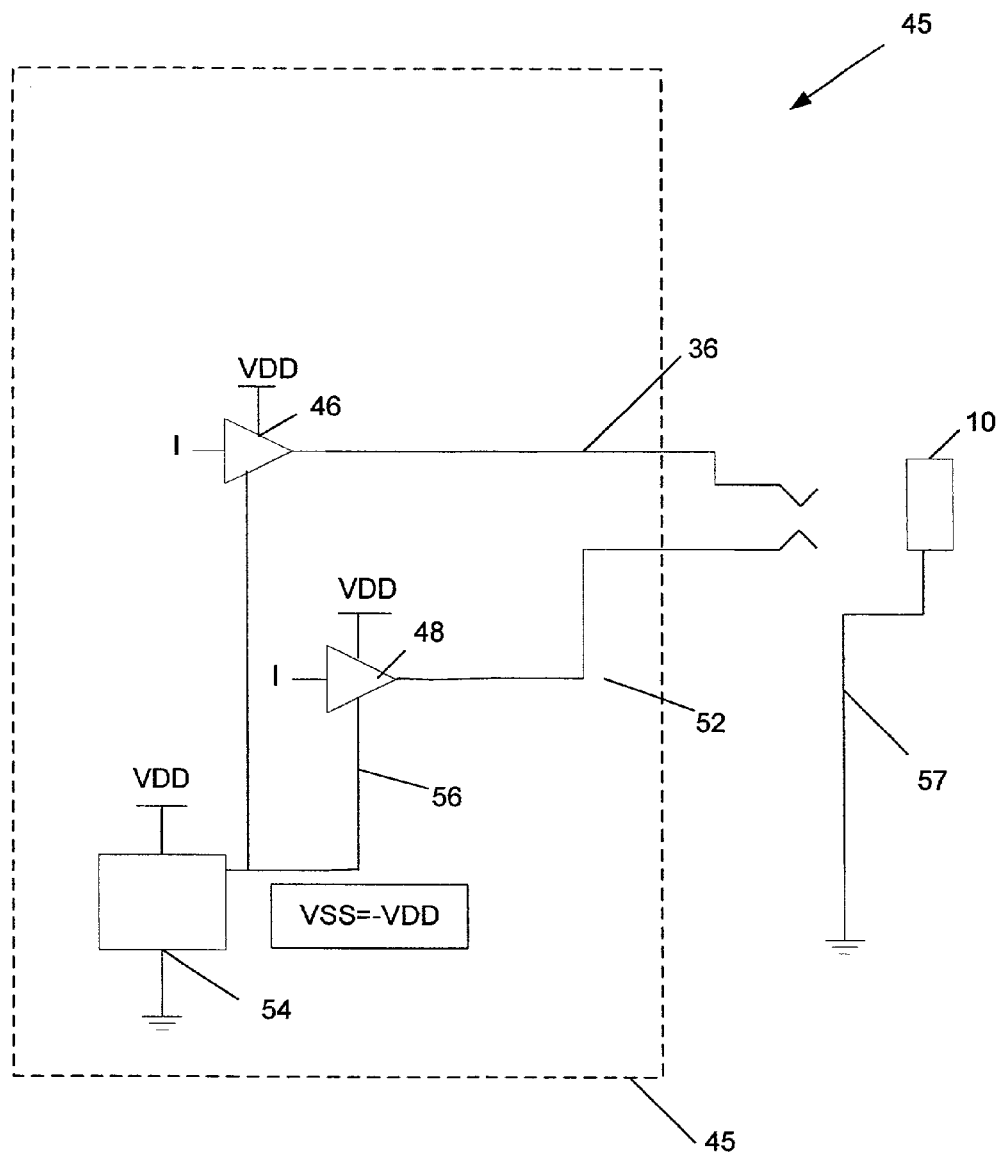
FIG. 4 illustrates a headphone amplifier circuit according to the present invention.

FIG. 4 illustrates a headphone amplifier circuit 45 according to the present invention. The headphone amplifier circuit 45 includes a first amplifier 46 driving the left headphone, a second amplifier 48 driving the right headphone, each amplifier coupled to its respective headphone load 10 via a connecting lead 50 and 52 respectively, and a charge pump 54. The headphones represented by the headphone load 10 are connected to a common ground 57. As shown in FIG. 4, instead of a third amplifier 40 shown in PRIOR ART FIG. 3 a charge pump circuitry 54 is used.

The term "charge pump" refers to a type of DC voltage to voltage converter that uses capacitors and in an alternative embodiment inductors to store and transfer energy. One type of charge pump (also referred to as switched-capacitor converters) includes a switch/diode network that charges and discharges one or more capacitors.

Alternatively, in implementing the present invention, a DC voltage to voltage converter may be used that includes an inductor.

The charge pump circuitry of the present invention generates a negative voltage rail −VDD with respect to ground, powering the output amplifiers and allowing driver amplifier operation from both positive and negative rails. Providing a negative voltage rail with respect to ground allows for the headphone amplifiers to be biased at ground voltage, allowing for the incoming signals to be amplified without clipping. As shown in FIG. 4, the two headphone amplifiers 46 and 48 have their positive power terminal connected to VDD the positive voltage supply, and VSS which is approximately equal to the negative value of VDD with respect to ground. This arrangement allows for the output terminal of both amplifiers 46 and 48 to be biased to ground, resulting in no significant DC voltage across the headphones and allowing the elimination of the large DC coupling capacitors 40 and 42 as shown in PRIOR ART FIG. 2.

Returning to FIG. 4, each of the headphone amplifiers 46 and 48 has one lead of its supply voltage terminal connected to the positive voltage rail VDD and another lead of its supply voltage terminal connected to the output 56 of the charge pump circuitry 54 supplying a negative voltage VSS equal to −VDD.

The headphone amplifier circuit 45 allows for the headphone 10 to be biased at zero volts, operating between VDD and −VDD which in turn allows for the leads 50 and 52 of the respective headphone amplifiers 46 and 48 to directly couple the headphone speakers 10 to the headphone amplifiers 46 and 48 without the need for any DC coupling capacitors in series.

Figure 5:
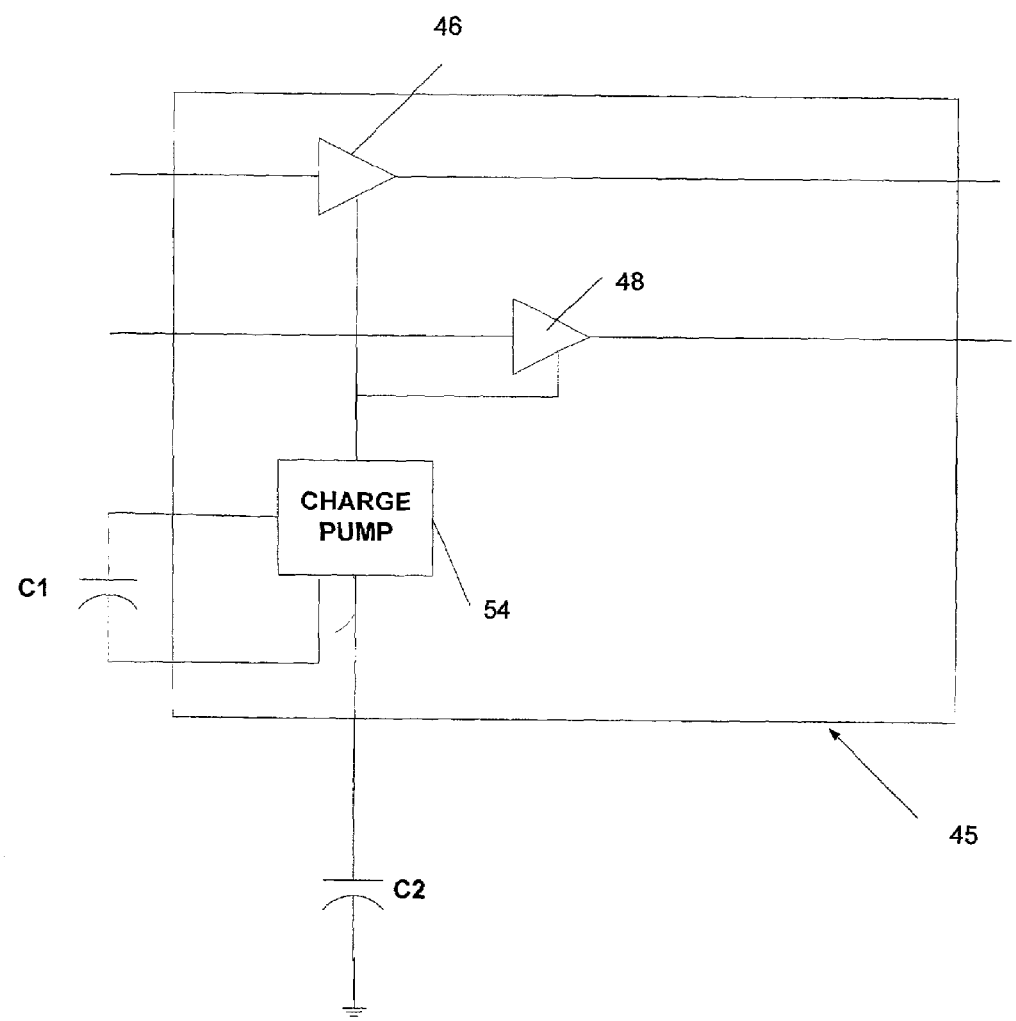
FIG. 5 illustrates one embodiment of the headphone amplifier system of the present invention in a circuit.

FIG. 5 illustrates one embodiment of the headphone amplifier system of the present invention in a circuit. The headphone amplifier system 45 includes a left headphone amplifier 46, a right headphone amplifier 48, a charge pump 54, and external capacitors C1 and C2. As shown in FIG. 5, in one embodiment of the present invention, the charge pump circuitry 54 and the power amplifiers 46 and 48 are implemented on a single integrated circuit (IC) chip 45. In this example, the charge pump 54 operation requires two small external capacitors C1 and C2. C1 is a called a "flying capacitor" and C2 is a "reservoir capacitor". The size of these two external capacitors are in the single digit micro Farad (µF) range as compared to the DC coupling capacitors of the prior art which are in the several hundred µF range.

Figure 6:
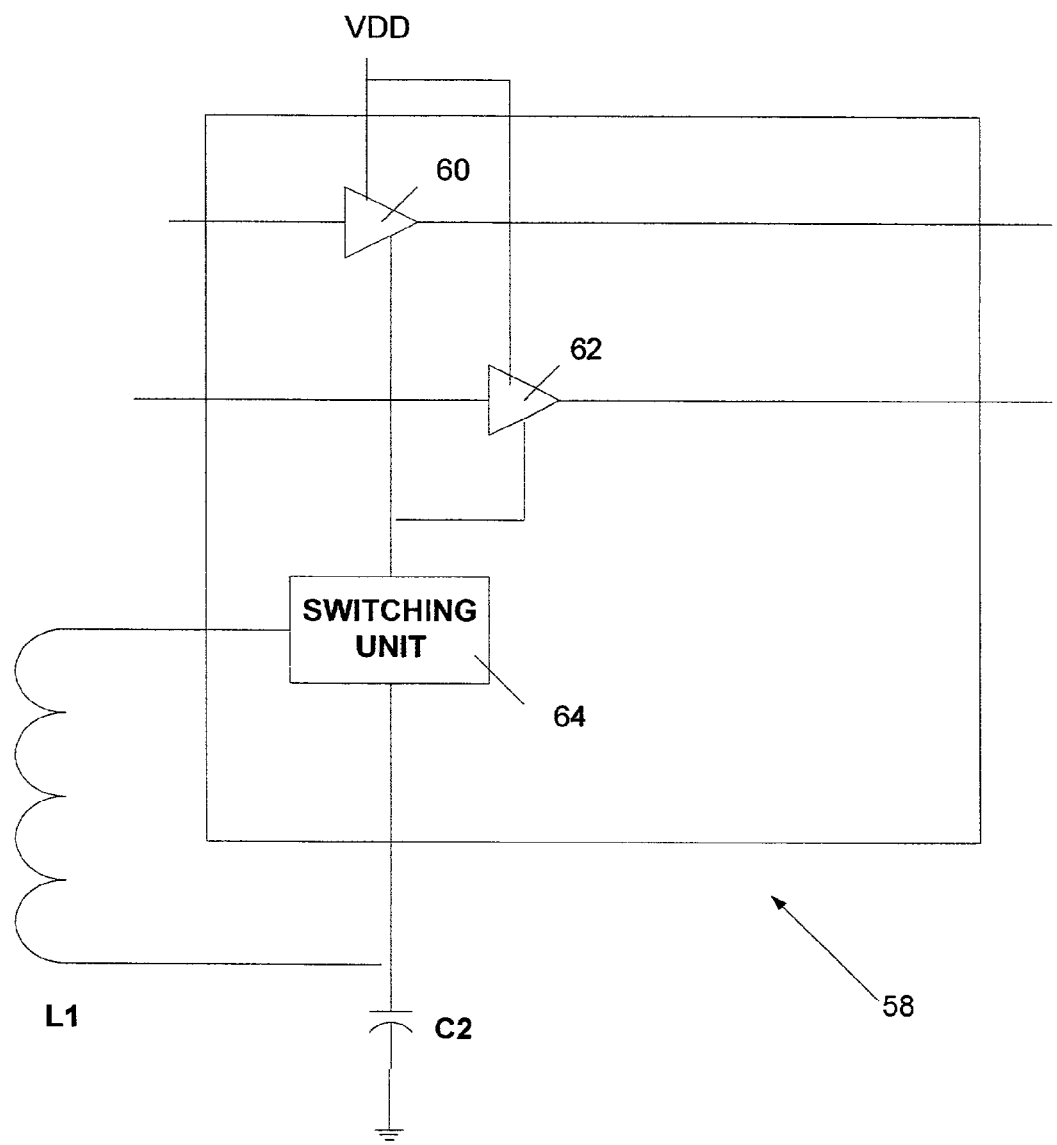
FIG. 6 is an illustration of an alternative embodiment of a headphone amplifier system according to the present invention.

FIG. 6 is an illustration of an alternative embodiment of a headphone amplifier system according to the present invention. As shown in FIG. 6, the headphone driver circuit 58 includes a first amplifier 60, a second amplifier 62, a switching unit 64, an external inductor L1 and an external capacitor C2. The inventive teachings of the present invention may further be implemented using an inductor based DC voltage to voltage converter. In one embodiment, the headphone driver circuit 58 may be implemented using discrete circuit components. In an alternative embodiment, an onboard inductor L1 may be used in conjunction with an integrated circuit that includes an integrated switching system as well as power amplifiers for driving the headphones. In this embodiment, an external inductor $L_1$ is used in conjunction with an external capacitor $C_1$ to convert a positive power supply voltage to a substantially equal but negative voltage supply. A switching unit 64 configures the circuit for each charge and discharge cycle. The headphone amplifiers 60 and 62 may be directly coupled to and drive their respective headphones without the need for DC coupling capacitors since the headphones are biased to ground and operate between VDD and −VDD, allowing for a complete incoming signal representation without any clipping.

Figure 7:
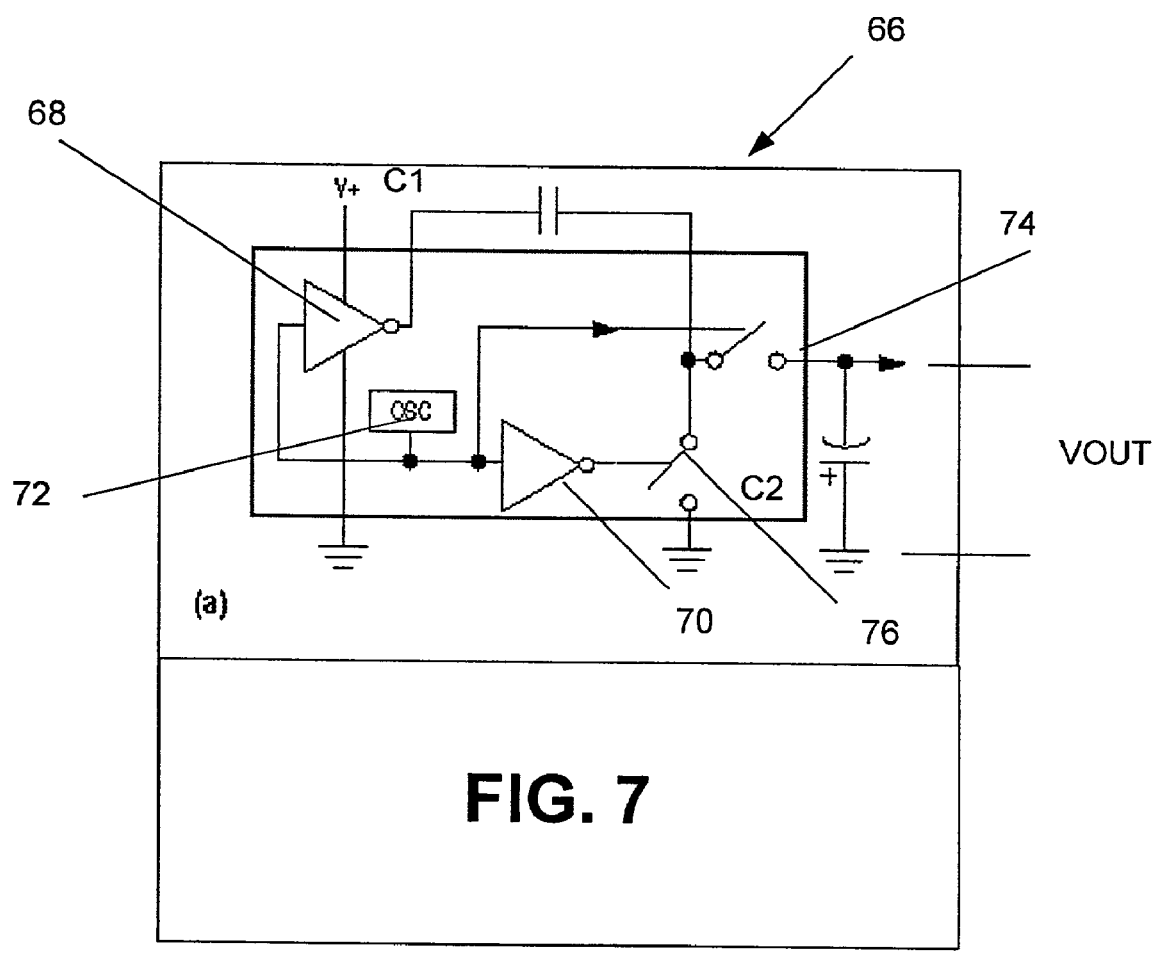
FIG. 7 is illustrates a simple capacitor based, IC charge pump circuitry.

FIG. 7 is illustrates a simple capacitor based, IC charge pump circuitry 66. The simple capacitor based IC charge pump circuitry 66 includes a pair of amplifier/inverters 68 and 70, an oscillator 72, a pair of switches 74 and 76, and a pair of external capacitors C1 and C2.

In the simple capacitor based IC charge pump circuitry 66, the switch network 74 and 76 toggles between charge and discharge states. An oscillator (OSC) 72 controls the two switches (74 and 76) that alternately charge a flying capacitor (C1) from an input voltage supplied by the amplifier 68 and 70, and discharge the flying capacitor (C1) into an output capacitor (C2). The voltage thus produced across the output capacitor C2 may be output as the output voltage (VOUT). Typically, the oscillator 72, the switches 74 and 76, and still other controls are all commonly contained in a single integrated circuit (IC).

The simple capacitor based IC charge pump circuitry 66 is of the step-up type, and it operates by stacking the potential of the charge in the flying capacitor C1 onto the potential of the input, and then charging the output capacitor C2 with this. The optimal result of this is an output voltage VOUT which is double that of the input voltage.

Those skilled in the electronic arts will readily appreciate that switched connections to the flying capacitor can be changed to simply shift charge from the input to the output, rather than to stack it as above. One very common type of step-down charge pump operates in this way, but further includes an appreciable resistance in the charge path to the flying capacitor. The resistance intentionally introduces a delay in the charging of the flying capacitor, and appropriate control of the oscillator is then used to switch the charge before it is able to reach the full input voltage potential. This type of charge pump may accordingly transfer charge quanta having only one-half, two-thirds, etc. of the input voltage, and thereby produce an output voltage which is correspondingly lower than the input voltage. This type of step-down charge pump is probably overwhelmingly the most common today, but it is not the only type possible. Alternative circuit arrangements allow for the generation of an output voltage VOUT which is equal to some negative quanta of the input voltage.

Figure 8:
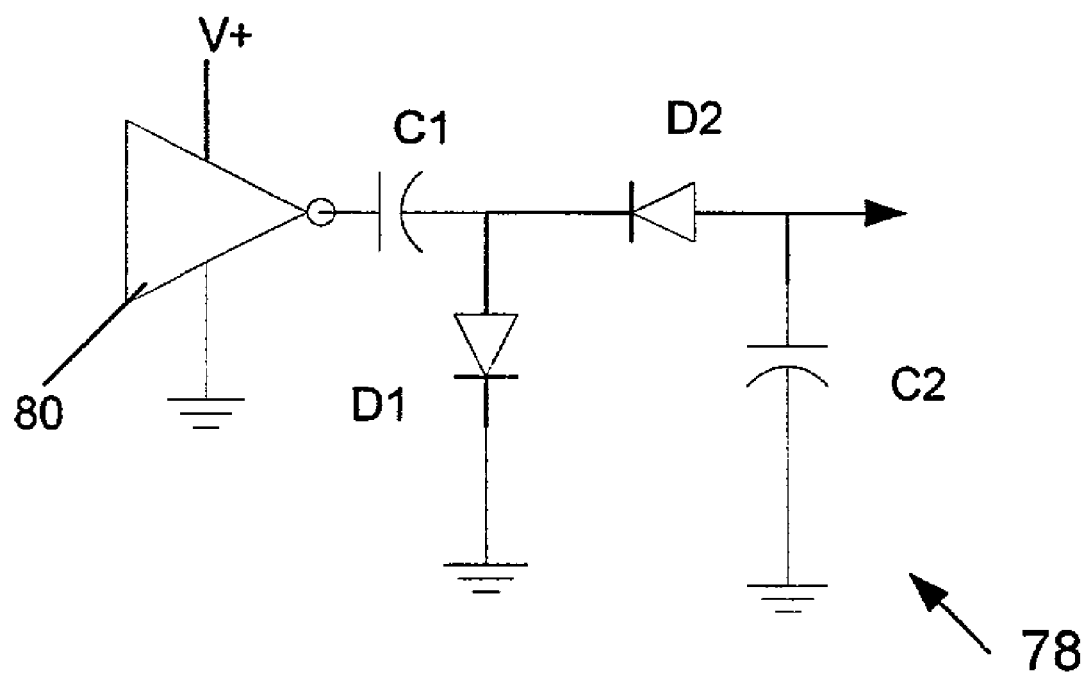
FIG. 8 is illustrates a simple capacitor based discrete charge pump circuitry.

FIG. 8 is illustrates a simple capacitor based discrete charge pump circuitry. The simple capacitor based discrete charge pump circuitry 78 includes an amplifier 80, a pair of capacitors C1 and C2, a pair of diodes or switches D1 and D2 and includes an input signal or external clock 82. In the capacitor based discrete charge pump circuit 78, the basic charge pump circuit is implemented in a discrete component circuit as shown in FIG. 8. The amplifier 80 charges a flying capacitor C1. The flying capacitor C1 shuttles charge across a diode D2 and diode D1. A reservoir capacitor C2 holds the charge and filters the output voltage VOUT. The external clock signal along with the two diodes D1 and D2 control the cycle and direction of the charge and discharge signals.

The foregoing examples illustrate certain exemplary embodiments of the invention from which other embodiments, variations, and modifications will be apparent to those skilled in the art. The invention should therefore not be limited to the particular embodiments discussed above, but rather is defined by the following claims.

I claim:

1. An amplifier circuitry for directly driving stereo headphones, said amplifier circuitry being driven by a single supply voltage VDD, said amplifier circuitry comprising:
   a first and a second amplifier, the first amplifier having an output directly coupled to a first headphone and the second amplifier having an output directly coupled to a second headphone, each of the first and second amplifier having a VDD power supply lead connected to a positive voltage supply VDD; and
   a charge pump circuitry output connected to a −VDD supply voltage of the first and second amplifier, wherein said charge pump circuitry output provides a voltage substantially equal in magnitude to the negative value of the VDD supply, said charge pump further having a power supply lead connected to the VDD supply voltage.

2. A direct drive charge pump enabled stereo headphone system comprising the following formed on a single integrated circuit;
   a single power input for providing, internal to said integrated circuit, a VDD supply voltage originating external to said integrated circuit;
   a charge pump coupled to said single power input and operable to provide, internal to said integrated circuit, a voltage substantially equal in magnitude to the negative value of said external VDD supply;
   a first headphone amplifier power by both said external VDD supply and said voltage substantially equal in magnitude to the negative value of said external VDD supply, said first headphone amplifier having a first audio input driven by a first audio signal provided external to said integrated circuit, and a first audio output suitable for directly driving a stereo headphone;
   a second headphone amplifier powered by both said external VDD supply and said voltage substantially equal in magnitude to the negative value of said external VDD supply, said second headphone amplifier having a second audio input driven by a second audio signal provided external to said integrated circuit, and a second audio output suitable for directly driving said stereo headphone; and
   whereby a single ground reference may be used for both said headphone system and said stereo headphone such that substantially no DC bias voltage exists across said first audio input and said second audio input with reference to said stereo headphone.

3. A direct drive charge pump enabled stereo headphone system as recited in claim 2, wherein said first audio input is an audio in for a right stereo headphone and said second audio input is an audio in for a left stereo headphone.

4. A direct drive charge pump enabled stereo headphone system as recited in claim 2, wherein said first audio input is coupled to an inverting terminal of said first headphone amplifier and said second audio input is coupled to an inverting terminal of said second headphone amplifier.

5. A direct drive charge pump enabled stereo headphone system as recited in claim 4, wherein a non-inverting terminal of said first headphone amplifier is coupled to a non-inverting terminal of said second headphone amplifier.

6. A direct drive charge pump enabled stereo headphone system as recited in claim 5, wherein said non-inverting terminal of said first headphone amplifier and said non-inverting terminal of said second headphone amplifier are coupled to ground.

7. A direct drive charge pump enabled stereo headphone system as recited in claim 2, further comprising:
- a first resistor coupled to said first audio input and an inverting terminal of said first headphone amplifier,
- a second resistor coupled to said first audio output and said inverting terminal of said first headphone amplifier,
- a third resistor coupled to said second audio input and an inverting terminal of said second headphone amplifier, and
- a fourth resistor coupled to said second audio output and said inverting terminal of said second headphone amplifier.

8. A direct drive charge pump enabled stereo headphone system as recited in claim 2, further comprising:
- a first capacitor having a first lead and a second lead, said first lead coupled to said charge pump and said second lead coupled to said charge pump, said first capacitor located off said integrated chip, and
- a second capacitor having a first lead and a second lead, said first lead coupled to said charge pump and said second lead couple to ground, said second capacitor located off said integrated chip.

9. A direct drive charge pump enabled stereo headphone system as recited in claim 2, further comprising a short circuit protection device.

10. A direct drive charge pump enabled stereo headphone system as recited in claim 2, further comprising a bias circuitry device.

11. A direct drive charge pump enabled stereo headphone system as recited in claim 2, wherein said first audio output is an audio out for a right stereo headphone and said second audio output is an audio out for a left stereo headphone.

12. A direct drive charge pump enabled stereo headphone system as recited in claim 2, further comprising a click/pop suppression device coupled to said first headphone amplifier and said second headphone amplifier.

13. A direct drive charge pump enabled stereo headphone system as recited in claim 2, further comprising a shutdown control device coupled to said charge pump.

14. A direct drive charge pump enabled stereo headphone system as recited in claim 12, further comprising a shutdown control device coupled to said charge pump and said click/pop suppression device.

15. A direct drive charge pump enabled stereo headphone system as recited in claim 2, further comprising:
- a first capacitor having a first lead and a second lead, said first lead coupled to a non-inverting terminal of said first headphone amplifier and said second lead coupled to said first audio input, said first capacitor located off said integrated chip, and
- a second capacitor having a first lead and a second lead, said first lead coupled to a non-inverting terminal of said second headphone amplifier and said second lead coupled to said second audio input, said second capacitor located off said integrated chip.

* * * * *